US012407332B2

(12) United States Patent
Ghabbour et al.

(10) Patent No.: US 12,407,332 B2
(45) Date of Patent: Sep. 2, 2025

(54) APPARATUS FOR PROVIDING PARALLEL FILTERING

(71) Applicant: Lear Corporation, Southfield, MI (US)

(72) Inventors: Youssef Ghabbour, Valls (ES); Julia Gine Elies, Valls (ES); Arturo Portugal Sanchez, Valls (ES)

(73) Assignee: LEAR CORPORATION, Southfield, MI (US)

(*) Notice: Subject to any disclaimer, the term of this patent is extended or adjusted under 35 U.S.C. 154(b) by 0 days.

(21) Appl. No.: 18/542,033

(22) Filed: Dec. 15, 2023

(65) Prior Publication Data

US 2025/0202457 A1 Jun. 19, 2025

(51) Int. Cl.
*H03H 15/00* (2006.01)
*H03H 11/12* (2006.01)
*H03H 21/00* (2006.01)

(52) U.S. Cl.
CPC ........ *H03H 15/00* (2013.01); *H03H 11/1291* (2013.01); *H03H 21/0012* (2013.01); *H03H 2210/043* (2013.01)

(58) Field of Classification Search
CPC ............... H03H 11/1291; H03H 15/00; H03H 21/0012; H03H 2210/043
USPC ................................. 327/551, 552, 553, 558
See application file for complete search history.

(56) References Cited

U.S. PATENT DOCUMENTS

| 8,259,431 B2 * | 9/2012 | Katta ..................... H03H 5/12 361/329 |
| 2007/0198149 A1 * | 8/2007 | Nishioka ............ B60G 17/015 340/425.5 |
| 2012/0194135 A1 | 8/2012 | Mizoguchi |
| 2019/0108691 A1 | 4/2019 | Tucker et al. |
| 2020/0412338 A1 | 12/2020 | Villalon |
| 2021/0028691 A1 | 1/2021 | Martinez Perez et al. |

FOREIGN PATENT DOCUMENTS

| AU | 2006227668 A1 | 9/2006 |
| AU | 2003296088 B2 | 9/2008 |
| BR | 112014004632 B1 | 4/2021 |
| BR | 112014001603 A2 | 8/2021 |
| BR | 112013020474 B1 | 9/2021 |
| BR | 112017016357 B1 | 3/2022 |
| CN | 100467696 C | 3/2009 |

(Continued)

*Primary Examiner* — William Hernandez
(74) *Attorney, Agent, or Firm* — BROOKS KUSHMAN P.C.

(57) ABSTRACT

In at least one embodiment, a system comprising a first circuit and a second circuit is provided. The first circuit includes a first filter filtering a first input signal and generating a first filtered output signal. The first circuit includes a first comparator comparing the first filtered output signal to a first threshold value and providing a first output signal indicative of a failure condition to one or more first processors. The second circuit includes a second filter filtering the first input signal and generating a second filtered output signal to filter the first input signal in less time than the first filter filtering the first input signal. The second circuit includes a second comparator comparing the second filtered output signal to a second threshold value and providing a second output signal indicative of the failure condition to one or more second processors.

20 Claims, 3 Drawing Sheets

(56) References Cited

FOREIGN PATENT DOCUMENTS

| | | | |
|---|---|---|---|
| CN | 1859862 B | 4/2010 |
| CN | 202509164 U | 10/2012 |
| CN | 105026632 A | 11/2015 |
| CN | 102959151 B | 4/2016 |
| CN | 105612279 A | 5/2016 |
| CN | 103328711 B | 6/2016 |
| CN | 104024511 B | 8/2016 |
| CN | 104080959 B | 2/2017 |
| CN | 106387295 A | 2/2017 |
| CN | 103998668 B | 3/2017 |
| CN | 103827376 B | 6/2017 |
| CN | 105683434 B | 7/2017 |
| CN | 104285003 B | 9/2017 |
| CN | 105705695 B | 1/2018 |
| CN | 207140883 U | 3/2018 |
| CN | 208484779 U | 2/2019 |
| CN | 109680413 A | 4/2019 |
| CN | 107614238 B | 2/2020 |
| CN | 107208339 B | 6/2020 |
| CN | 107532357 B | 8/2020 |
| CN | 111989430 A | 11/2020 |
| CN | 112020578 A | 12/2020 |
| CN | 107708493 B | 1/2021 |
| CN | 107208340 B | 2/2021 |
| CN | 113166995 A | 7/2021 |
| CN | 213618701 U | 7/2021 |
| CN | 113930900 A | 1/2022 |
| CN | 109680412 B | 2/2022 |
| DE | 3127303 A1 | 1/1983 |
| DE | 3690196 C1 | 10/1989 |
| DE | 102004053133 A1 | 5/2006 |
| DE | 102006020306 A1 | 11/2007 |
| DE | 112013005643 T5 | 8/2015 |
| DE | 202018104691 U1 | 11/2019 |
| DE | 112019002208 T5 | 1/2021 |
| DK | 1832675 T3 | 6/2013 |
| DK | 2772576 T3 | 5/2015 |
| DK | 3255192 T3 | 3/2020 |
| EP | 0240388 A2 | 10/1987 |
| EP | 0805064 A2 | 11/1997 |
| EP | 0890430 A2 | 1/1999 |
| EP | 0894885 B1 | 11/2002 |
| EP | 1586687 A1 | 10/2005 |
| EP | 1270787 B1 | 6/2010 |
| EP | 1858944 B1 | 7/2011 |
| EP | 2532502 A1 | 12/2012 |
| EP | 2565304 A1 | 3/2013 |
| EP | 1832675 B1 | 4/2013 |
| EP | 1683446 B1 | 7/2013 |
| EP | 2489770 B1 | 1/2015 |
| EP | 2772576 B1 | 4/2015 |
| EP | 2653598 B1 | 7/2016 |
| EP | 2792776 B1 | 10/2017 |
| EP | 2792775 B1 | 11/2017 |
| EP | 2848721 B1 | 1/2018 |
| EP | 3305500 A1 | 4/2018 |
| EP | 2751312 B1 | 7/2018 |
| EP | 3064627 B1 | 8/2018 |
| EP | 3064628 B1 | 8/2018 |
| EP | 2894246 B1 | 10/2018 |
| EP | 2966206 B1 | 11/2018 |
| EP | 3256632 B1 | 3/2019 |
| EP | 3255192 B1 | 1/2020 |
| EP | 3779017 A1 | 2/2021 |
| EP | 3826820 A1 | 6/2021 |
| EP | 3889332 A1 | 10/2021 |
| EP | 3610760 B1 | 11/2021 |
| EP | 3974572 A1 | 3/2022 |
| ES | 2335962 B1 | 4/2010 |
| ES | 2346180 T3 | 10/2010 |
| FR | 2432108 A1 | 2/1980 |
| FR | 2675440 B1 | 12/1993 |
| FR | 2850260 A1 | 7/2004 |
| FR | 3050409 B1 | 10/2017 |
| FR | 3063461 B1 | 3/2019 |
| FR | 3109753 B1 | 11/2021 |
| GB | 721866 A | 1/1955 |
| GB | 2275695 A | 9/1994 |
| GB | 2576141 A | 2/2020 |
| GB | 2577591 B | 4/2021 |
| GB | 2589497 B | 11/2021 |
| IN | 201717042989 A | 3/2018 |
| IN | 336480 B | 5/2020 |
| IN | 202047045846 A | 10/2020 |
| IN | 351780 B | 11/2020 |
| IN | 382056 B | 11/2021 |
| IN | 202117027707 A | 11/2021 |
| JP | 2022011946 A | 1/2022 |

\* cited by examiner

| Signal | Parameter | Measurement in HW.0.7.0 | Measurement in HW.0.8.0 |
|---|---|---|---|
| HV_V | (*) OV alarm $t_d$ | Approx. same as in HV UV alarm | 26 μs |
|  | UV alarm $t_d$ | 51 μs | 12 μs |
|  | (*) DSP_ADC $f_c$(+368) | 40.8 kHz | 18.5 kHz (reduced to mitigate aliasing) |
| HV_I | Buck-mode OC alarm $t_d$ | 356 μs | 33 μs |
|  | Boost-mode OC alarm $t_d$ | Same as in Buck-mode | Same as in Buck-mode |
|  | (*) DSP_ADC $f_c$(+368) | 40.8 kHz | 30 kHz (reduced to mitigate aliasing) |
| LV_V | (*) OV alarm $t_d$ | Approx. same as in LV UV alarm | 31 μs |
|  | UV alarm $t_d$ | 736 μs | 28 μs |
|  | (*) DSP_ADC $f_c$(+368) | 172 Hz | 2 kHz |
| LV_I | Buck-mode OC alarm $t_d$ | 202 μs | 40 μs |
|  | Boost-mode OC alarm $t_d$ | Same as in Buck-mode | Same as in Buck-mode |
|  | (*) DSP_ADC $f_c$(+368) | 4.2 kHz | 12.7 kHz |

Fig-3

APPARATUS FOR PROVIDING PARALLEL FILTERING

TECHNICAL FIELD

Aspects disclosed herein generally relate to a system for providing parallel filtering. These aspects and others will be discussed in more detail herein.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It is to be understood that the disclosed embodiments are merely exemplary and that various and alternative forms are possible. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ embodiments according to the disclosure.

"One or more" and/or "at least one" includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Aspects disclosed herein generally provide a system that performs parallel filtering for a sensing circuit. The sensing circuit senses an incoming voltage for example an on-board charging device (OBC). The disclosed system comprises a first circuit comprising at least a first filter and a second circuit comprising at least a second filter. Each of the first circuit and the second circuit receive a first input signal that is indicative of at least a sensed voltage condition in the system. The first filter operates a first operating frequency, and the second filter operates at a second operating frequency. The second operating frequency of the second filter is greater than the first operation frequency thereby enabling the second circuit to detect a failure condition of the system faster than the first circuit detecting the failure condition. Generally, the second circuit outputs an output signal to transmit to one or more processors (or microprocessors and/or digital signal processors (DSPs)) in the system to quickly disable the system to mitigate the failure condition.

The first circuit also detects the failure condition however such detection is performed at a time that that is greater than that of the second circuit detecting the failure condition due to the first operating frequency being less than the second operating frequency. In this case, the first circuit detects the failure condition to report out the detected failure condition to other processors (e.g., in the vehicle for diagnostic purposes and/or to be used as a redundant check on the first circuit). Thus, it may not be necessary for the first circuit to detect the failure condition at the same rate as that of the second circuit.

The first operating frequency for the first filter and the second operating frequency for the second filter are based on a first time constant and a second time constant, respectively. As disclosed herein, a correlation exists between the electronics used to form the first circuit and the second circuit and the various time constants at which the first and second filters operate. For example, the first time constant may be derived based on values for a first resistive and capacitive network of the first filter. Similarly, the second time constant may be derived based on values for a second resistive and capacitive network of the second filter. Other implementations that are used to detect failure conditions via parallel filtering methods in a system utilize buffer circuits (or operational amplifiers) to isolate the filters from one another. The disclosed system eliminates the need for the buffer circuits. In addition, the disclosed system provides a failure detection mechanism that may be applied to any number of applications that have differing delay times, alarm thresholds, responses to ramp or step behaviors, etc. In addition, the disclosed system may be well suited for applications that require redundant detection mechanisms in place to provide any number of parallel measurements.

Figure 1:
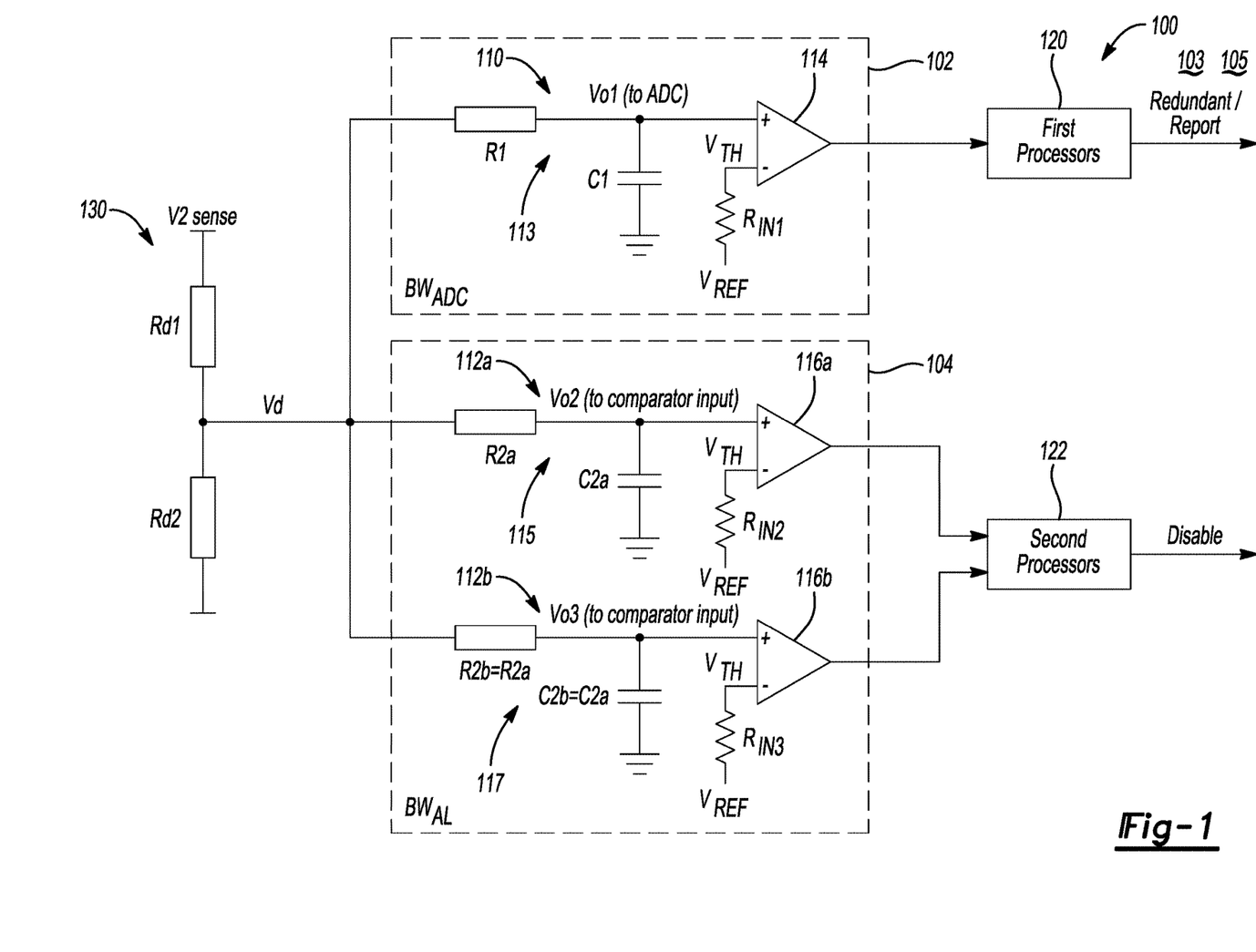
FIG. 1 depicts an apparatus for providing parallel filtering in accordance with one embodiment.

FIG. 1 depicts a system 100 (or apparatus) for providing parallel filtering and for detecting failure conditions in accordance with one embodiment. The system 100 generally includes a first circuit 102, a second circuit 104. It is recognized that the system 100 may include any number of circuits that operate similar to any one of the first circuit 102 and/or the second circuit 104. In general, each of the first circuit 102 and the second circuit 104 are configured to detect fault conditions (or failure condition) (e.g., over voltage condition, undervoltage condition, over current condition and/or under current condition) attributed to a sensed input (e.g., sensed voltage or sensed current). In one example, the system 100 detects fault conditions for an on-board charger (OBC) 103 in a vehicle 105. It is contemplated that the system 100 may be used for any application that is configured to detect a fault condition.

The system 100 includes a sense input circuit 130 that provides a first input signal indicative of the sensed voltage to the first circuit 102 and the second circuit 104. The first circuit 102 includes a first filter 110 and a first comparator 114. A first resistive and capacitive network 113 generally forms the first filter 110. The first resistive and capacitive network 113 includes resistor R1 and capacitor C1. In one example, the first filter 110 is a low pass filter. It is recognized that the first filter 110 may be a high pass filter, band pass filter, etc. The first filter 110 filters the incoming sensed voltage and provides an output to the first comparator 114. The first comparator 114 compares the output from the first filter 110 to a threshold which then outputs a first output signal indicative of a detected fault based on the comparison.

The first filter 110 operates at a first frequency when performing the filtering operation. The relevance of the first frequency will be more discussed in more detail below. The first circuit 102 provides an output (or the first output signal) to one or more first processors 120 ("the first processor 120") indicating the presence of a fault detection condition in the system 100. The first processor 120 may include one or more first microcontrollers or one or more first digital signal processors (DSPs). It is recognized that the first DSPs may operate faster than the first microcontrollers. The first processor 120 reports the presence of a failure as a diagnostic feature and may transmit an indication of the detected fault condition to alert users of the condition. The fault condition may correspond to an over voltage condition, an under-voltage condition, an over current condition, or an under current condition. In the case of a detected over current condition or an under current condition, the first circuit 102 reports such a condition to the first DSPs since the first DSPs respond faster than the first microcontrollers. In the case of a detected over voltage condition or under voltage condition, the first circuit 102 reports such a condition to the first microcontrollers as the faults related to over and under voltage conditions may not have the same priority as that of the detected over and under current conditions.

In a similar fashion, the second circuit 104 also provides an output (or the second output signal) to one or more second processors 122 (i.e., "the second processor 122") in response to detecting the failure condition. The second processor 122 may include one or more second microcontrollers or one or more second digital signal processors (DSPs). It is recognized the second DSPs may operate faster than that of the second microcontrollers. For example, the second circuit 104 receives the first input signal from the sense input circuit 130 that is indicative of the sensed voltage (or current) in the system 100. The second circuit 104 includes a second filter 112a and a second comparator 116a. A second resistive and capacitive network 115 generally forms the second filter 112a. The second resistive and capacitive network 115 includes resistor R2a and capacitor C2a. In one example, the second filter 112a is a low pass filter. It is recognized that the second filter 112a may be a high pass filter, band pass filter, etc. The second filter 112a filters the incoming sensed voltage and provides an output (e.g., a second output signal) to the second comparator 116a. The second comparator 116a compares the output from the second filter 112a to a threshold which then outputs the second output signal indicative of a detected fault based on the comparison.

The second filter 112a operates at a second frequency when performing the filtering operation. The second frequency may be greater than the first frequency of that used by the first filter 110. The second circuit 104 provides the second output signal to one or more second processors 122 indicating the presence of the fault detection condition in the system 100. The second processor 122 disables the system 100 to prevent the fault condition from damaging electronics or other devices in the system 100 in response to detecting the fault condition. In one example, the second processor 122 (e.g., the second DSP) may disable the charging operation being performed between the OBC 103 and the vehicle 105 in matter of microseconds. The fault condition may correspond to an over voltage condition, an under-voltage condition, an over current condition, or an under current condition.

Generally, the second circuit 104 is tasked with detecting the fault condition as quickly as possible since the second circuit 104 transmits the second output signal to the second processor 122 to disable the system 100 (or OBC 103) when a fault condition is detected. For example, the second processor 122 may control any number of direct current (DC) to DC converters (not shown) that converts a high voltage incoming signal during a charging operation of the vehicle 105. Upon detecting or receiving the second output signal from the second circuit 104, the second processor 122 disables the battery charging operation given the high voltage conversion that takes place to mitigate any potential issues. The first processor 120 as noted above in connection with the first circuit 102 may detect the presence of the failure condition in response to receiving the first output signal from the first circuit 102 and notify other microprocessors (or controllers) in the vehicle 105 that a failure condition (e.g., over voltage condition or undervoltage condition) has been detected in connection with the vehicle charging operation. However, the first processor 120 may not be directly responsible for controlling the various DC/DC converters that perform the energy conversion during the battery charging operations and may simply log the presence of the fault detection in the event this condition is present so that other measures may be taken. If however, the first circuit 102 is arranged to detect an over current or under current condition, then the first circuit 102 reports such a condition to both the first microcontroller and the first DSP of the first processor 120. The first output signal as output by the first circuit 102 may serve as a redundant output and be utilized to disable the charging operation in the event the second processor 122 has malfunctioned.

Thus, by operating the second filter 112a of the second circuit 104 at a second frequency that is greater than that of the first frequency for the first circuit 102, the second circuit 104 is configured to process (e.g., filter the first input signal indicative of the sensed voltage or current with the second filter 112a) faster than that of the first circuit 102 (e.g., faster than the first filter 110) and hence detect the fault condition earlier in time when viewed in reference to the first circuit 102. The second circuit 104 is also able to report out the fault detection the second processor 122 faster than the first circuit 102 is able to report out the fault condition to the first processor 120.

The second circuit 104 includes a third filter 112b and a third comparator 116b. Each of the first filter 110, the second filter 112a, and the third filter 112b are included in the system 100 since each input these filters 110, 112a, and 112b provide are independent readings from one another and therefore provide redundant measuring circuits. A third resistive and capacitive network 117 generally forms the third filter 112b. The third resistive and capacitive network 117 includes resistor R2b and capacitor C2b. In one example, R2b is equal to R2a and C2b is equal to C2a. In another example, the third filter 112c is a low pass filter. It is recognized that the third filter 112c may be a high pass filter, band pass filter, etc. The third filter 112b filters the incoming sensed voltage and provides an output to the third comparator 116b. The third comparator 116b compares the output from the third filter 112a to a threshold which then outputs a third output signal indicative of a detected fault based on the comparison.

The third filter 112b operates at a third frequency when performing the filtering operation. The third frequency may be greater than the first frequency of that used by the first filter 110. In one example, the third frequency may be similar (or equal) to the second frequency of the second filter 112a. The third circuit 112b also provides the third output signal to the second processor 122 indicating the presence of the fault detection condition in the system 100. As noted above, the second processor 122 disables the system 100 to prevent the fault condition from damaging electronics or other devices in the system 100 in response to detecting the fault condition.

The second circuit 104 is tasked with detecting the fault condition as quickly as possible since the second circuit 104 transmits the second output signal to the second processor 122 to disable the system 100 (or OBC 103) when a fault condition is detected. Thus, by operating the third filter 112b of the second circuit 104 at the second frequency that is greater than that of the first frequency for the first circuit 102, the second circuit 104 is configured to process (e.g., filter the first input signal indicative of the sensed voltage with the second filter 112a) faster (or in less than time) than that of the first circuit 102 and hence detect the fault condition earlier in time when viewed in reference to the first circuit 102. The second circuit 104 is also able to report out the fault detection the second processor 122 faster than the first circuit 102 is able to report out the fault condition to the first processor 120. In one example, the second processor 122 disables the OBC 103 based on receiving the second output signal from the second circuit 104 prior to the first processor 120 reporting the failure condition based on receiving the first output from the first circuit 102 given that the second filter 112a and the third filter 112b operate at the second frequency (and also have a larger frequency range).

Input threshold resistors Rin1, Rin2, and Rin3 for the first comparator 114, the second comparator 116a, and the third comparator 116b, respectively, provide a threshold voltage, $V_{TH}$ (or threshold current) for each of the first comparator 114, the second comparator 116a, and the third comparator 116b. Thus, the resistance values for the input threshold resistors Rin1, Rin2, and Rin2 may be selected to enable the first comparator 114, the second comparator 116a, and the third comparator 116b to provide an output that is indicative of an overvoltage condition, an undervoltage condition, the overcurrent condition, and/or the undercurrent condition. While two circuits 102 and 104 are shown, it is recognized that any number of circuits may be included in the system 100 to provide a plurality of outputs that correspond to a detected overvoltage condition.

In general, the operating frequencies (e.g., the first frequency for the first filter 110, the second frequency for the second filter 112a, and the third frequency for the third filter 112b) can be calculated by the following equation which is a function of the time constant (e.g., "$\tau$"):

$$f_c = \frac{1}{2\pi RC} = \frac{1}{2\pi \tau} \tag{1}$$

Thus, in this regard, the selection of particular resistance and capacitance values (e.g., R1 and C1) for the first resistive capacitive network 113 at least partially establish the first frequency (or $f_1$). Similarly, the particular resistance and capacitance values (e.g., R2a, C2a and R2b, C2b) for the second and third capacitive networks 115 and 117, respectively, at least partially form the second frequency for the second filter 112a and the third filter 112b. In one example, the second filter 112a and the third filter 112b may both operate at the second frequency. In this regard, the resistance value for R2a and the capacitance value for C2a of the second resistive and capacitive network 115 are equal to the resistance value R2b and the capacitance value for C2b of the third resistive and capacitive network 117. In another example, it is recognized that the second filter 112a and the third filter 112b may operate at different frequencies from one another but may still be arranged to operate faster than that of the first filter 113. In this regard, the resistance values for R2a and R2b may be different from one another and/or the capacitance values for C2a and C2b may be different from one another. By selecting the various values for the RC networks for the first filter 110, the second filter 112a, and/or the third filter 112, to achieve the desired frequencies to control the speed at which the first circuit 102 and the second circuit 104 measure the sensed voltage, such an implementation yields increased performance no longer requires additional electronics and achieves a cost saving.

Figure 2:
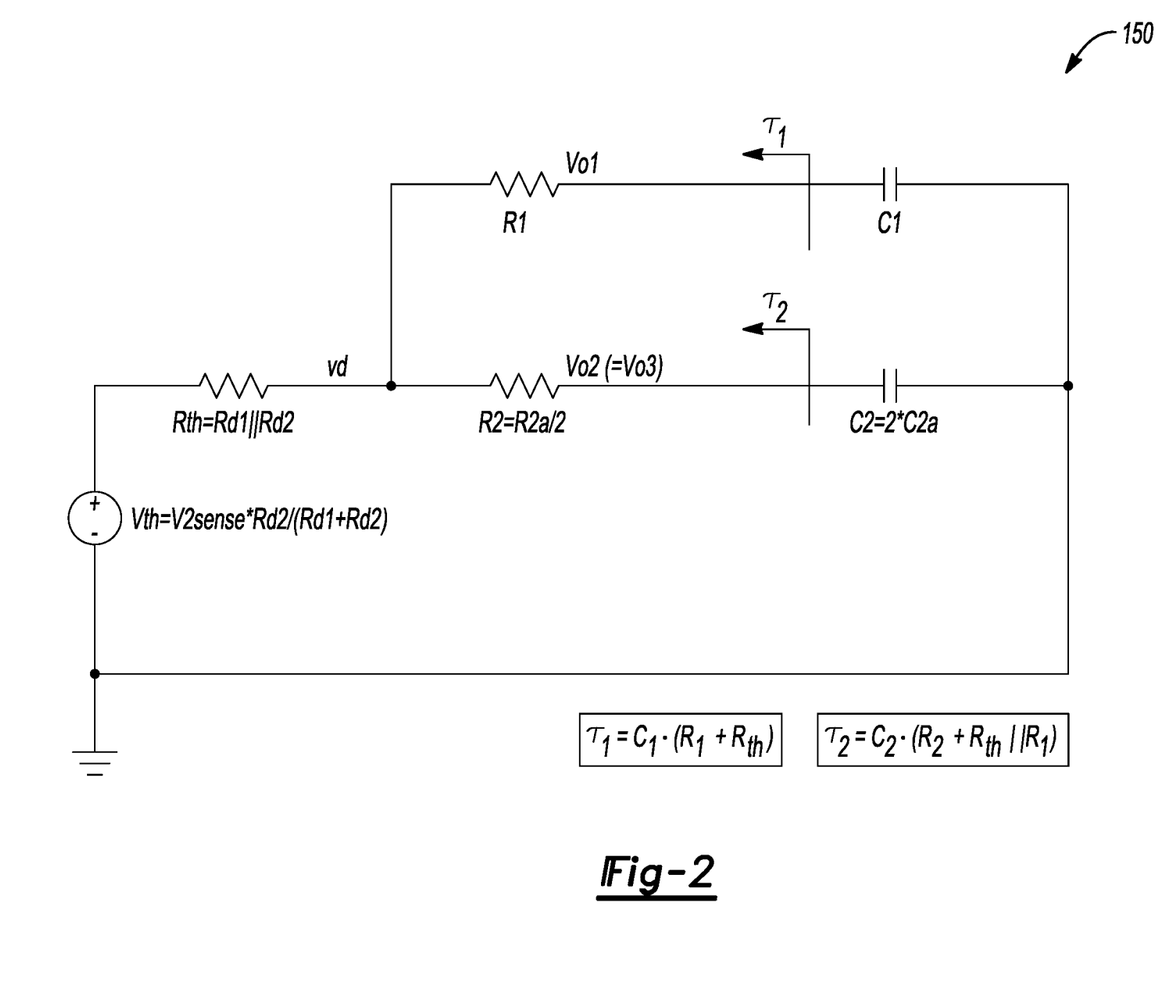
FIG. 2 depicts an equivalent circuit that indicates the manner in which a first time constant and a second time constant are determined in accordance with one embodiment.

FIG. 2 depicts an equivalent circuit 200 that indicates the manner in which a first time constant (e.g. t1) and a second time constant (e.g. t2) are determined in accordance with one embodiment. The first frequency for the first filter 110 is based on the first time constant (e.g., t1). Similarly, the second frequency for the second filter 112a and the third filter 112b is based on the second time constant (e.g. t2) assuming that both the second filter 112a and the third filter 112b operate at the same frequency. As noted above, the second filter 112a and the third filter 112b may operate at different frequencies from one another so long as such frequencies enable the second filter 112a and the third filter 112b to operate (or perform the filtering operation) faster than that of the first filter 110.

The circuit 200 generally corresponds to aspects shown in connection with the first circuit 102, the second circuit 104, and the sense input circuit 130. For example, the circuit 200 includes the resistors R1, R2, Rd1 and Rd2 and capacitors C1, C2. The first time constant, t1 is generally defined (or formed) based on the following equation:

$$\tau_1 = C1*(R1+R_{th}) \quad (2)$$

where $R_{th}=Rd1\|Rd2$.

The second time constant, $\tau_2$ is generally defined (or formed) based on the following equation:

$$\tau_2 = C2*(R2+R_{th}\|R1) \quad (3)$$

where $C2=2*C2a$ and $R2=R2a/2$.

Conversely, the first time constant $\tau_1$ and the second time constant $\tau_2$ may be provided as follows: $\tau_1=C1*(R1)$ or $\tau_2=C2a*(R2a)$ (or $\tau_2=C2b*(R2b)$). Thus, as shown, the various resistance values for the resistors R1, R2a, Rd1, Rd2 and the capacitance values for the capacitors C1 and C2a may be used to generate the first time constant and the second time constant based on the equations shown above. The first time constant and the second time constant may be used based on equation (1) above to derive the first frequency and the second frequency for the first filter 110 and the second filter 112a and consequently the third filter 112b. Given the foregoing, it can be seen that the first time constant is greater than the second time constant (or $\tau_1 > \tau_2$) in order for the first frequency for the first filter 110 to be less than the second frequency for the second filter 112a and the third filter 112b (e.g., in order for the second filter 112a (or the third filter 112b)) to operate faster than the first filter 110.

Figure 3:
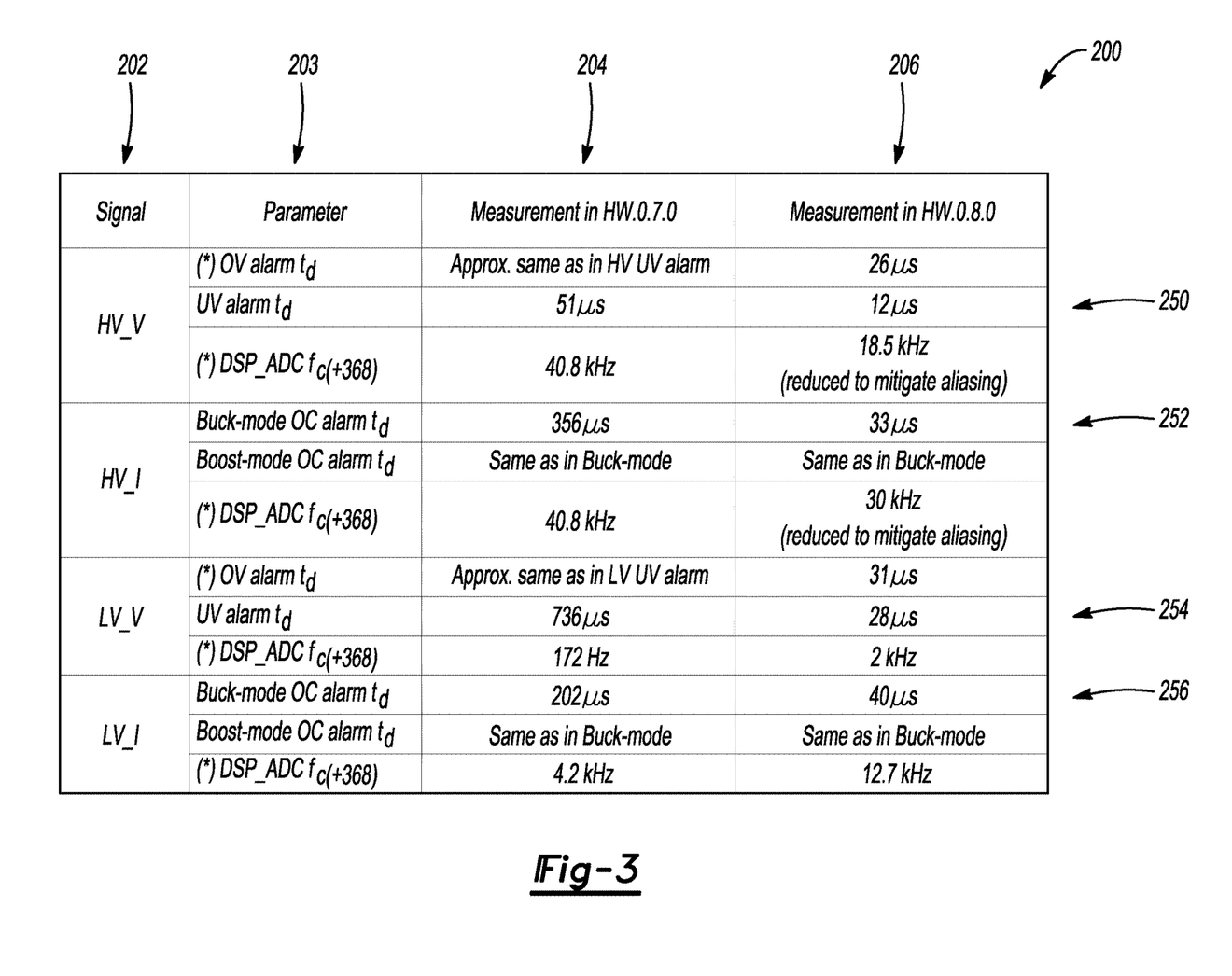
FIG. 3 depicts various measurements of a sensed voltage and reaction times for disabling a charging operation.

FIG. 3 depicts a table 200 illustrating various measurements of the sensed voltage and reaction times for disabling a charging operation. In general, the table 200 includes first column 202, second column 203, third column 204, and fourth column 206. The first column 202 generally corresponds to various sensed signals for voltages or currents. The second column 203 generally corresponds to various signal parameters. The third column 204 generally corresponds to first measurements as performed by a system that does not include aspects of the disclosed system 100. The fourth column 206 generally corresponds to second measurements as performed by the disclosed system 100.

In one example, the sensed signals as shown in first column 202 of the table 200 correspond to sensed voltages or currents on a HV network in the vehicle 105. In another example, the sensed signals in the first column 202 of the table 200 correspond to sensed voltages or currents on a low voltage (LV) network in the vehicle 105. The second column 203 depicts various parameters that correspond to the sensed characteristics (e.g., voltage or current). The third column 204 depicts various measurement times as performed by a different system (not the disclosed system 100) for each of the sensed voltages and currents that are shown in the first column 202. The fourth column 206 depicts various measurement times for each of the sensed voltages and currents that are shown in the first column 202 as performed by the first circuit 102 of the system 100.

As generally shown at 250, the different system measures the sensed voltage on the HV network at 51 μs whereas the system 100 (or the second circuit 104) as disclosed herein generally measures the sensed voltage on the HV network at 12 μs. As generally shown at 252, the different system measures/detects the sensed current on the HV network at 356 μs whereas the system 100 (or the second circuit 104) as disclosed herein measures/detects the sensed current on the HV network at 33 μs. As generally shown at 254, the different system generally measures the sensed voltage on the LV network at 736 μs whereas the system 100 (or the second circuit 104) as disclosed herein generally measures/detects the sensed voltage on the LV network at 28 μs. As generally shown at 256, the different system generally measures/detects the sensed current on the HV network at 202 μs whereas the system 100 (or the second circuit 104) as disclosed herein measures/detects the sensed current on the HV network at 40 μs. Thus, the system 100 exhibits a faster reaction period over the different system in any one or more cases.

Item 1. A system comprising a first circuit and a second circuit. The first circuit comprising a first filter filtering a first input signal indicative of at least a sensed voltage condition in the system, the first filter generating a first filtered output signal in response to filtering the first input signal at a first frequency. The first circuit comprising a first comparator comparing the first filtered output signal to a first threshold value and providing a first output signal indicative of a failure condition to one or more first processors to report the failure condition based on the comparison of the first filtered output signal to the first threshold value. The second circuit comprising a second filter filtering the first input signal indicative of the at least the sensed voltage condition within the system, the second filter generating a second filtered output signal in response to filtering the first input signal at a second frequency that is greater than the first frequency enabling the second filter to filter the first input signal in less time than the first filter filtering the first input signal. The second circuit comprising a second comparator comparing the second filtered output signal to a second threshold value and providing a second output signal indicative of the failure condition to one or more second processors disabling the system prior to the one or more first processors reporting the failure condition based on the comparison of the second filtered output signal to the second threshold value.

Item 2. According to item 1, the second circuit comprising a third filter filtering the first input signal indicative of the at least the sensed voltage condition, and wherein the third filter generating a third filtered output signal in response to filtering the first input signal at the second frequency that is greater than the first frequency enabling the second filter to filter the first input signal in less time than the first filter filtering the first input signal.

Item 3. According to item 2, the second circuit comprising a third comparator comparing the third filtered output signal to a third threshold value and providing a third output signal indicative of the failure condition to the one or more second processors, and the one or more second processors disabling the system prior to the one or more first processors reporting the failure condition based on the comparison of the second filtered output signal to the third threshold voltage.

Item 4. According to item 3, the third threshold value for the third comparator is different than the second threshold value for the second comparator.

Item 5. According to item 4, the second comparator outputs a signal indicative of an overvoltage condition based on the comparison the second filtered output signal to the second threshold value.

Item 6. According to item 4, the third comparator outputs a signal indicative of an undervoltage condition based on the comparison of the third filtered output signal to the third threshold value.

Item 7. According to item 1, the first frequency for the first filter is based on a first time constant and the second frequency for the second filter is based on a second time constant, and wherein the first time constant is different from the second time constant.

Item 8. According to item 7, the first time constant is greater than the second time constant.

Item 9. According to item 7, further comprising a sense input circuit comprising at least one sensing resistor being electrically connected with the first filter and the second filter providing the first input signal that is indicative of the sensed voltage condition.

Item 10. According to item 9, the first time constant and the second time constant are each partially based on a resistance value of the least one sensing resistor.

Item 11. According to item 7, the first filter is formed from a first resistive and capacitive network and the second filter is formed from a second resistive and capacitive network.

Item 12. According to item 11, the first time constant is at least partially based on a first resistance value and a first capacitance value of the first resistive and capacitive network, and the second time constant is at least partially based on a second resistance value and a second capacitance value of the second resistive and capacitive network.

Item 13. According to item 1, the first filter is a low pass filter.

Item 14. According to item 1, wherein the second filter is a low pass filter.

Item 15. A system comprising a first circuit and a second circuit. The first circuit comprising a first filter filtering a first input signal indicative of at least a sensed voltage condition, the first filter generating a first filtered output signal in response to filtering the first input signal at a first frequency, and a first comparator comparing the first filtered output signal to a first threshold value and providing a first output signal indicative of a failure condition to one or more first processors to report the failure condition based on the comparison of the first filtered output signal to the first threshold value. The second circuit comprising a second filter filtering the first input signal indicative of the at least the sensed voltage condition within the system, the second filter generating a second filtered output signal in response to filtering the first input signal at a second frequency that is greater than the first frequency enabling the second filter to filter the first input signal in less time than the first filter filtering the first input signal. The second circuit comprising a second comparator comparing the second filtered output signal to a second threshold value and providing a second output signal indicative of the failure condition to one or more second processors. The first frequency of the first filter is based at least on a first time constant and the second frequency of the second filter is based at least on a second time constant, and the second time constant is less than the first time constant causing the second filter to filter the first input signal in less time than the first filter filtering the first input signal.

Item 16. According to item 15, the system comprising a sense input circuit comprising at least one sensing resistor being electrically connected with the first filter and the second filter providing the first input signal that is indicative of the sensed voltage condition.

Item 17. According to item 16, the first time constant and the second time constant are each partially based on a resistance value of the least one sensing resistor.

Item 18. According to item 15, the first filter is formed from a first resistive and capacitive network, and the second filter is formed from a second resistive and capacitive network.

Item 19. According to item 18, the first time constant is at least partially based on a first resistance value and a first capacitance value of the first resistive and capacitive network and the second time constant is at least partially based on a second resistance value and a second capacitance value of the second resistive and capacitive network.

Item 20. A system comprising a first filter, a first comparator, and a second filter. The first filter filtering a first input signal indicative of at least a sensed voltage condition in the system, the first filter generating a first filtered output signal in response to filtering the first input signal at a first frequency. The first comparator comparing the first filtered output signal to a first threshold value and providing a first output signal indicative of a failure condition to one or more first processors to report the failure condition based on the comparison of the first filtered output signal to the first threshold value. The second filter filtering the first input signal indicative of the at least the sensed voltage condition within the system, the second filter generating a second filtered output signal in response to filtering the first input signal at a second frequency that is different than the first frequency enabling the second filter to filter the first input signal in less time than the first filter filtering the first input signal. The second comparator comparing the second filtered output signal to a second threshold value and providing a second output signal indicative of the failure condition to one or more second processors disabling the system prior to the one or more first processors reporting the failure condition based on the comparison of the second filtered output signal to the second threshold value.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system comprising
   a first circuit comprising:
      a first filter filtering a first input signal indicative of at least a sensed voltage condition in the system, the first filter generating a first filtered output signal in response to filtering the first input signal at a first frequency, and
      a first comparator comparing the first filtered output signal to a first threshold value and providing a first output signal indicative of a failure condition to one or more first processors to report the failure condition based on the comparison of the first filtered output signal to the first threshold value; and
   a second circuit comprising:
      a second filter filtering the first input signal indicative of the at least the sensed voltage condition within the system, the second filter generating a second filtered output signal in response to filtering the first input signal at a second frequency that is greater than the first frequency enabling the second filter to filter the first input signal in less time than the first filter filtering the first input signal, and a second comparator comparing the second filtered output signal to a second threshold value and providing a second output signal indicative of the failure condition to one or more second processors disabling the system prior to the one or more first processors reporting the failure condition based on the comparison of the second filtered output signal to the second threshold value.

2. The system of claim 1, wherein the second circuit comprises a third filter filtering the first input signal indicative of the at least the sensed voltage condition, and wherein the third filter generating a third filtered output signal in response to filtering the first input signal at the second frequency that is greater than the first frequency enabling the second filter to filter the first input signal in less time than the first filter filtering the first input signal.

3. The system of claim 2, wherein the second circuit comprises a third comparator comparing the third filtered output signal to a third threshold value and providing a third output signal indicative of the failure condition to the one or more second processors, and wherein the one or more second processors disabling the system prior to the one or more first processors reporting the failure condition based on the comparison of the second filtered output signal to the third threshold voltage.

4. The system of claim 3, wherein the third threshold value for the third comparator is different than the second threshold value for the second comparator.

5. The system of claim 4, wherein the second comparator outputs a signal indicative of an overvoltage condition based on the comparison of the second filtered output signal to the second threshold value.

6. The system of claim 4, wherein the third comparator outputs a signal indicative of an undervoltage condition based on the comparison of the third filtered output signal to the third threshold value.

7. The system of claim 1, wherein the first frequency for the first filter is based on a first time constant and the second frequency for the second filter is based on a second time constant, and wherein the first time constant is different from the second time constant.

8. The system of claim 7, wherein the first time constant is greater than the second time constant.

9. The system of claim 7 further comprising a sense input circuit comprising at least one sensing resistor being electrically connected with the first filter and the second filter providing the first input signal that is indicative of the sensed voltage condition.

10. The system of claim 9, wherein the first time constant and the second time constant are each partially based on a resistance value of the least one sensing resistor.

11. The system of claim 7, wherein the first filter is formed from a first resistive and capacitive network and the second filter is formed from a second resistive and capacitive network.

12. The system of claim 11, wherein the first time constant is at least partially based on a first resistance value and a first capacitance value of the first resistive and capacitive network, and wherein the second time constant is at least partially based on a second resistance value and a second capacitance value of the second resistive and capacitive network.

13. The system of claim 1, wherein the first filter is a low pass filter.

14. The system of claim 1, wherein the second filter is a low pass filter.

15. A system comprising:
a first circuit comprising:
a first filter filtering a first input signal indicative of at least a sensed voltage condition, the first filter generating a first filtered output signal in response to filtering the first input signal at a first frequency, and
a first comparator comparing the first filtered output signal to a first threshold value and providing a first output signal indicative of a failure condition to one or more first processors to report the failure condition based on the comparison of the first filtered output signal to the first threshold value; and
a second circuit comprising:
a second filter filtering the first input signal indicative of the at least the sensed voltage condition within the system, the second filter generating a second filtered output signal in response to filtering the first input signal at a second frequency that is greater than the first frequency enabling the second filter to filter the first input signal in less time than the first filter filtering the first input signal, and
a second comparator comparing the second filtered output signal to a second threshold value and providing a second output signal indicative of the failure condition to one or more second processors,
wherein the first frequency of the first filter is based at least on a first time constant and the second frequency of the second filter is based at least on a second time constant, and
wherein the second time constant is less than the first time constant causing the second filter to filter the first input signal in less time than the first filter filtering the first input signal.

16. The system of claim 15 comprising a sense input circuit comprising at least one sensing resistor being electrically connected with the first filter and the second filter providing the first input signal that is indicative of the sensed voltage condition.

17. The system of claim 16, wherein the first time constant and the second time constant are each partially based on a resistance value of the least one sensing resistor.

18. The system of claim 15, wherein the first filter is formed from a first resistive and capacitive network, and wherein the second filter is formed from a second resistive and capacitive network.

19. The system of claim 18, wherein the first time constant is at least partially based on a first resistance value and a first capacitance value of the first resistive and capacitive network and the second time constant is at least partially based on a second resistance value and a second capacitance value of the second resistive and capacitive network.

20. A system comprising:
a first filter filtering a first input signal indicative of at least a sensed voltage condition in the system, the first filter generating a first filtered output signal in response to filtering the first input signal at a first frequency, and
a first comparator comparing the first filtered output signal to a first threshold value and providing a first output signal indicative of a failure condition to one or more first processors to report the failure condition based on the comparison of the first filtered output signal to the first threshold value; and
a second filter filtering the first input signal indicative of the at least the sensed voltage condition within the system, the second filter generating a second filtered output signal in response to filtering the first input signal at a second frequency that is different than the first frequency enabling the second filter to filter the first input signal in less time than the first filter filtering the first input signal, and a second comparator comparing the second filtered output signal to a second threshold value and providing a second output signal indicative of the failure condition to one or more second processors disabling the system prior to the one or more first processors reporting the failure condition based on the comparison of the second filtered output signal to the second threshold value.

* * * * *